US005780770A

United States Patent [19]

Christianson et al.

[11] Patent Number: 5,780,770

[45] Date of Patent: Jul. 14, 1998

[54] FLUID COOLED ELECTRICAL CONDUCTOR ASSEMBLY

[75] Inventors: Jan Christianson, Berrien Springs; Ed Walton, Big Rapids; Erwin Kroulik, Edmore, all of Mich.

[73] Assignee: Flex-Cable, Inc., Morley, Mich.

[21] Appl. No.: 744,854

[22] Filed: Nov. 18, 1996

[51] Int. Cl.$^{6}$ .............................. H02G 3/03; H05K 7/20

[52] U.S. Cl. .............................. 174/15.1; 174/19

[58] Field of Search .............................. 174/19, 22 R, 174/74 R, 15.1, 15.5, 15.7, 84 C

[56] References Cited

U.S. PATENT DOCUMENTS

| | | | |
|---|---|---|---|
| 1,959,150 | 5/1934 | Basch et al. | 174/74 R X |
| 3,601,520 | 8/1971 | Carasso | 174/15.7 |
| 3,917,898 | 11/1975 | Iketani et al. | 174/15 C |
| 4,394,533 | 7/1983 | Naito | 174/15.7 X |
| 4,640,982 | 2/1987 | Kasper et al. | 174/75 |
| 4,963,694 | 10/1990 | Alexion et al. | 174/15.6 |
| 4,966,560 | 10/1990 | Marzouk | 439/585 |
| 4,991,289 | 2/1991 | French | 29/863 |
| 5,142,763 | 9/1992 | Toya et al. | 29/517 |
| 5,229,543 | 7/1993 | Strefling | 174/15.6 |
| 5,301,421 | 4/1994 | Strefling | 29/863 |
| 5,484,961 | 1/1996 | Itoh et al. | 174/84 |
| 5,488,199 | 1/1996 | Selsing et al. | 174/19 X |

*Primary Examiner*—Bot L. Ledynh
*Assistant Examiner*—Dean A. Reichard
*Attorney, Agent, or Firm*—Taylor & Associates, P.C.

[57] ABSTRACT

The invention is directed to a fluid cooled electrical conductor assembly. The fluid cooled electrical conductor assembly includes a terminal having an open end and a fluid passage in communication with the open end. A sleeve is at least partially received within the open end of the terminal. The sleeve is metallurgically bonded to the terminal, such as by solder. The sleeve has a flared end disposed around an electrical conductor and a distal end disposed adjacent to an end of the conductor. The sleeve has a longitudinally extending groove which is in communication with the fluid passage in the terminal. A casing is connected to the terminal and surrounds the conductor to thereby define a fluid passageway at a periphery of the conductor. During manufacture, a single sleeve is swedged onto an electrical conductor and subsequently cut in half to define two substantially identical sleeves which may be inserted into respective terminals.

10 Claims, 2 Drawing Sheets

FLUID COOLED ELECTRICAL CONDUCTOR ASSEMBLY

BACKGROUND OF THE INVENTION

1. Field of the Invention

The present invention relates to electrical conductors, and, more particularly, to fluid cooled electrical conductors.

2. Description of the Related Art

Fluid cooled electrical conductor assemblies typically include an electrical conductor which is connected with a terminal having a fluid passage therein. A casing or hose is disposed around the electrical conductor and is connected with the terminal in a sealed manner so as to define a fluid passageway around the periphery of the electrical conductor. Cooling fluid passes through the fluid passage in the terminal and over the electrical conductor within the casing to remove heat generated by the electrical conductor during operation.

One known method of connecting the electrical conductor to the terminal is to solder the electrical conductor to an end of the terminal. A problem with this connection technique is that the electrical conductor is typically in the form of a multiple-conductor wire and the solder wicks along the wire between the multi-conductors in a direction away from the solder joint. This results in a mechanical stress point occurring in the multi-conductor wire at a location where the solder stops when the wire is bent. The wire may break at the point where the solder stops as a result of fatigue failure associated with the increased mechanical stresses.

Another known method of attaching an electrical conductor to a terminal is to use a sleeve which is crimped to the electrical conductor. The sleeve is thereafter placed within a terminal body and the terminal body is crimped to the sleeve. A problem with this technique is that voids or spaces between the two crimped surfaces of the sleeve and terminal body at the crimping site results in a higher electrical resistance at the interface between the sleeve and the terminal. Electrical conductivity between the sleeve and terminal may therefore not be suitable for a particular application. Moreover, the pull-out strength between the sleeve and terminal may vary from one crimped connection to another and may not be as strong as desired for a particular application.

Another problem with using a sleeve of conventional design as described above is that the sleeve is generally of cylindrical design with a crimp along one side thereof. After the sleeve is crimped onto the electrical conductor, increased mechanical stresses occur at the end of the sleeve from which the conductor extends. If the electrical conductor is bent in a transverse direction relative to the longitudinal direction of the sleeve, fatigue failure of the electrical conductor may occur as a result of the increased stresses.

What is needed in the art is a fluid cooled electrical conductor assembly which provides increased conductivity between the sleeve and terminal, increased pull-out strength between the sleeve and terminal, and a decreased possibility of fatigue failure of the electrical conductor when the conductor is bent relative to the sleeve.

SUMMARY OF THE INVENTION

The present invention provides a fluid cooled electrical conductor assembly having a sleeve which is attached to an electrical conductor and soldered to a terminal. The sleeve has an end opposite the terminal which is flared to allow the conductor to be bent relative to the terminal and reduce fatigue failure of the conductor during bending. During manufacture, the sleeve is swedged onto an electrical conductor and cut in half in a transverse direction to define two substantially identical sleeves which may be inserted into respective terminals.

The invention comprises, in one form thereof, a fluid cooled electrical conductor assembly including a terminal having an open end and a fluid passage in communication with the open end. A sleeve is at least partially received within the open end of the terminal. The sleeve is metallurgically bonded to the terminal, such as by solder. The sleeve has a flared end disposed around an electrical conductor and a distal end disposed adjacent to an end of the conductor. The sleeve has a longitudinally extending groove which is in communication with the fluid passage in the terminal. A casing is connected to the terminal and surrounds the conductor to thereby define a fluid passageway at a periphery of the conductor.

The invention comprises, in another form thereof, a method of manufacturing a fluid cooled electrical conductor assembly. A sleeve is provided which has a longitudinal direction. The sleeve is slid over at least one electrical conductor such that the sleeve is disposed around the at least one electrical conductor at each end thereof. The sleeve is swedged to the at least one electrical conductor, whereby a longitudinally extending groove is formed in the sleeve. The sleeve is cut in half in a direction transverse to the longitudinal direction, whereby two substantially identical sleeves are formed with an electrical conductor attached to each of the two sleeves. One of the two sleeves is inserted into an open end of a terminal having a fluid passage, whereby the longitudinally extending groove is in communication with the fluid passage.

An advantage of the present invention is that the sleeve is formed with a flared end opposite the terminal to control an extent to which the electrical conductor can be bent relative to the terminal, and reduce fatigue failure of the conductor during bending.

Another advantage is that the sleeve is positively attached to the terminal via solder at a location on the exterior of the sleeve such that fluid flow past the sleeve is not substantially affected.

Yet another advantage is that during manufacture, a single sleeve is swedged onto an electrical conductor and subsequently cut in half to define two substantially identical sleeves which may be inserted into respective terminals.

BRIEF DESCRIPTION OF THE DRAWINGS

The above-mentioned and other features and advantages of this invention, and the manner of attaining them, will become more apparent and the invention will be better understood by reference to the following description of an embodiment of the invention taken in conjunction with the accompanying drawings, wherein.

Corresponding reference characters indicate corresponding parts throughout the several views. The exemplification set out herein illustrates one preferred embodiment of the invention, in one form, and such exemplification is not to be construed as limiting the scope of the invention in any manner.

DETAILED DESCRIPTION OF THE INVENTION

Figure 1:
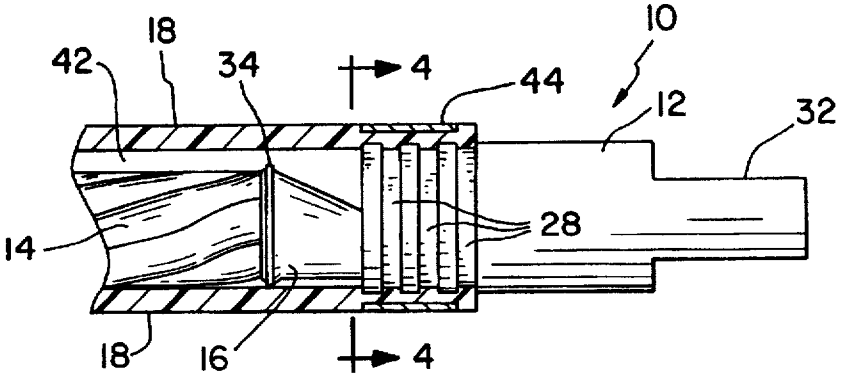
FIG. 1 is a side, partially sectioned view of an embodiment of a fluid cooled electrical conductor assembly of the present invention.

Referring now to the drawings and particularly to FIGS. 1–4, there is shown an embodiment of a fluid cooled electrical conductor assembly 10 of the present invention. In general, fluid cooled electrical conductor assembly 10 includes a terminal 12, electrical conductor 14, sleeve 16 and casing 18.

Terminal 12 has an open end 20 defining a cavity 22 which is sized and configured for receiving a sleeve 16 therein. Terminal 12 also includes a fluid passage 24 (FIG. 3) which is in fluid communication with cavity 22 of open end 20. Fluid passage 24 includes an internally threaded portion 26 which extends to a periphery of terminal 12. Internally threaded portion 26 is adapted for threading engagement with an externally threaded connector (not shown), which in turn is connected with a fluid source (not shown) which effects a flow of cooling fluid through fluid passage 24 and cavity 22. Terminal 12 also includes a plurality of circumferential grooves 28 which assist in the interconnection with casing 18, as will be described below. A hole 30 formed in a lug 32 allows terminal 12 to be connected to a suitable electrical structure, such as a power source or load (not shown).

Electrical conductor 14, in the embodiment shown, is a multi-conductor wire in the form of a braided or twisted wire rope. Conductor 14 is sized and configured according to the anticipated electrical power which is transmitted therethrough. In the particular embodiment shown, conductor 14 has a diameter of approximately 0.845 inch.

Sleeve 16 is attached to and disposed around electrical conductor 14. More particularly, sleeve 16 includes a flared end 34 which is disposed around electrical conductor 14 and a distal end 36 (FIG. 3) which is disposed adjacent an end of conductor 14. Flared end 34 allows conductor 14 to be bent relative to sleeve 16. More particularly, flared end 34 has an inside surface with a shape which affects the extent to which conductor 14 may be bent relative to sleeve 16 (such as the flare angle or the contour of the inside surface). The extent to which flared end 34 is flared from sleeve 16 affects the degree at which conductor 14 may be bent relative to sleeve 16. Flared end 34 also reduces fatigue failure of conductor 14 when conductor 14 is bent relative to sleeve 16.

Sleeve 16 is at least partially received within open end 20 of terminal 12. Sleeve 16 is metallurgically bonded to terminal 12 to improve electrical conductivity between sleeve 16 and terminal 12, and to increase the pull out strength between sleeve 16 and terminal 12. In the embodiment shown, sleeve 16 is connected via solder 40 (FIG. 3) to terminal 12 at an exterior surface of sleeve 16. The solder 40 is positioned around the exterior of sleeve 16 such that fluid flow through longitudinally extending groove 38 is not substantially affected.

Sleeve 16 is formed with a longitudinally extending groove 38 (FIGS. 2 and 4) which is disposed in fluid communication with fluid passage 24 of terminal 12 when sleeve 16 is inserted into open end 20 of terminal 12. Groove 38 allows cooling fluid to flow past sleeve 16 when sleeve 16 is inserted into terminal 12.

Casing 18 is connected to terminal 12 and surrounds conductor 14 to define a fluid passageway 42 (FIG. 1) at a periphery of conductor 14. Casing 18, in the particular embodiment shown, is in the form of a non-conductive rubber or polymeric hose having an internal diameter of approximately 1.0 inch. Hose 18 is slid over a portion of terminal 12 to engage circumferential grooves 28, and is held in place using a clamp 44, such as a stainless steel band.

Figure 2:
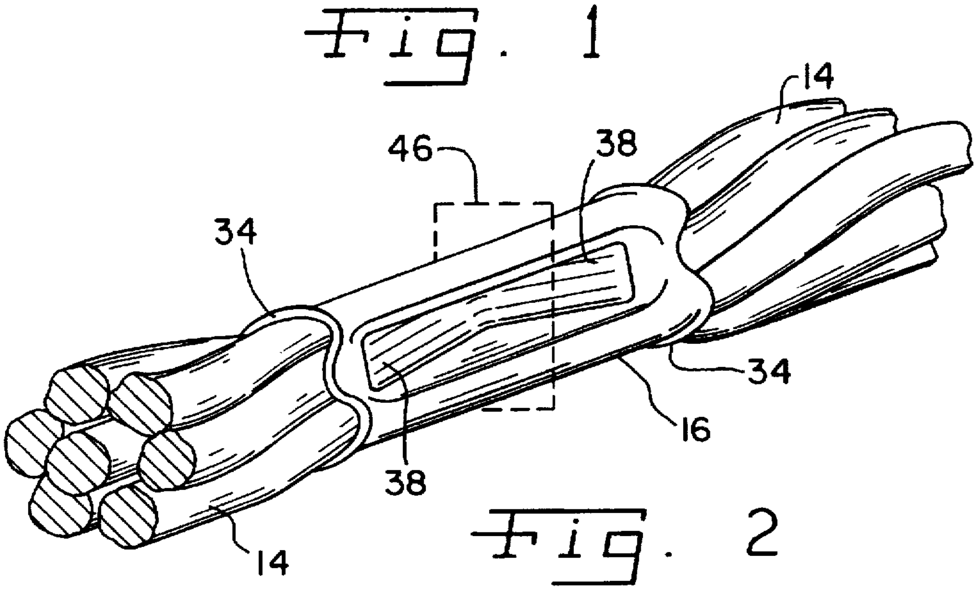
FIG. 2 is a perspective view of the sleeve shown in FIG. 1 during the manufacture thereof, with the sleeve connected at each end thereof to an electrical conductor.
Figure 3:
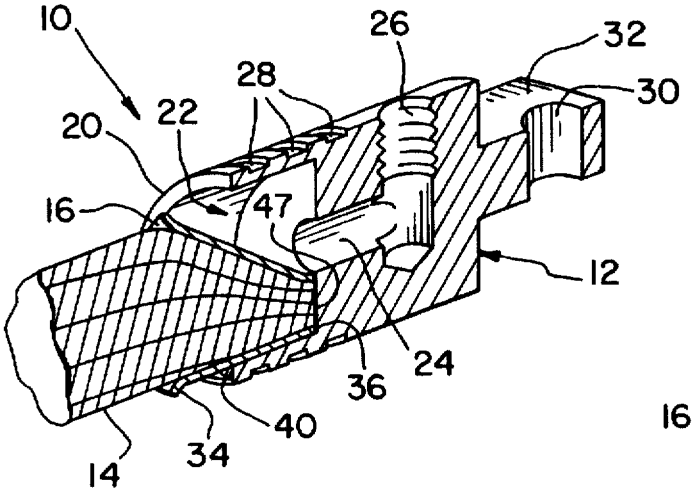
FIG. 3 is a perspective, sectional view of the fluid cooled electrical conductor assembly shown in FIG. 1.
Figure 4:
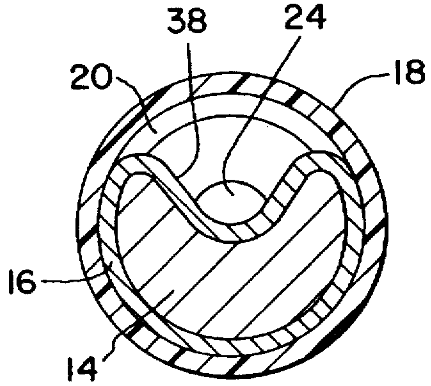
FIG. 4 is a sectional view taken along line 4—4 in FIG. 1.
Figure 5:
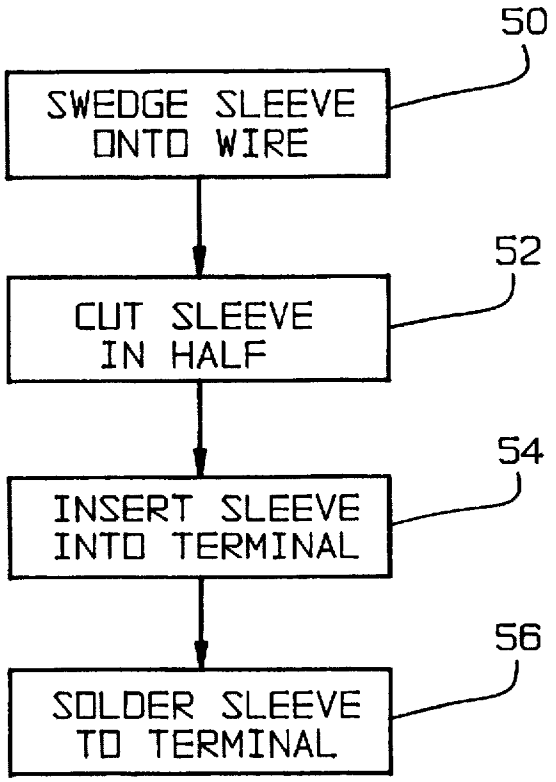
FIG. 5 is a flow chart illustrating a method of manufacturing the fluid cooled electrical conductor assembly shown in FIGS. 1 and 3.

FIG. 5 is a flow chart illustrating a method of manufacturing the fluid cooled electrical conductor assembly 10 shown in FIGS. 1–4. A sleeve 16 is formed with a flared end 34 at each end thereof. After the flared ends are formed, sleeve 16 is then slid over at least one electrical conductor 14 such that sleeve 16 is disposed around the electrical conductor at each end thereof. That is, sleeve 16 may be slid over a single electrical conductor, or may be slid over the ends of two abutting electrical conductors. Sleeve 16 is then swedged onto the electrical conductor(s) whereby a longitudinally extending groove 38 is formed (block 50 and FIG. 2). At this point in the manufacturing process, groove 38 is substantially V-shaped when viewed perpendicular to the longitudinal direction of sleeve 16. Sleeve 16 is then cut in half in a direction transverse to the longitudinal direction (block 52), whereby two substantially identical sleeves are formed with an electrical conductor attached to each of the two sleeves. The cut may be taken, for example, along a plane 46 (FIG. 2) extending through sleeve 16. In the particular embodiment shown, plane 46 extends through sleeve 16 in a direction which is substantially perpendicular to the longitudinal direction of sleeve 16. The end of conductor 14 at plane 46 in FIG. 2 is sufficiently compacted via the swedging operation such that all air gaps are substantially eliminated between the wire strands of conductor 14. Eliminating the air gaps at the end of conductor 14 provides an effective seal at the cut surface represented by plane 46 such that molten solder is substantially prevented from wicking-up the wire strands of conductor 14. After cutting sleeve 16, one of the two substantially identical sleeves 16 is inserted into open end 20 of terminal 12, whereby the longitudinally extending groove 38 is in fluid communication with fluid passage 24 of terminal 12 (block 54). Sleeve 16 is then metallurgically bonded to terminal 12. More particularly, an end of conductor 14 and sleeve 16 are soldered to terminal 12 at solder joint 47, and sleeve 16 is soldered at an exterior thereof to terminal 12 (block 56) via solder joint 40. Solder joint 47 provides a high pull-out strength and low electrical resistance between conductor 14 and terminal 12. The solder at solder joint 40 is positioned on sleeve 16 such that fluid flow through open end 20 and past sleeve 16 is not substantially affected.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A fluid cooled electrical conductor assembly, comprising:

an electrical conductor having a longitudinal direction and an end;

a terminal having an open end, a fluid passage in communication with said open end, and an inside face disposed between said fluid passage and said open end, said inside face oriented transverse to said longitudinal direction;

a sleeve at least partially received within said open end of said terminal, said sleeve and said conductor end being metallurgically bonded to said inside face of said terminal, said sleeve having a flared end disposed around said conductor and a distal end disposed adjacent to said conductor end, said sleeve being increasingly narrow from said flared end to said distal end,said sleeve having a longitudinally extending groove which is in communication with said fluid passage in said terminal; and a casing connected to said terminal and surrounding said conductor to thereby define a fluid passageway at a periphery of said conductor.

2. The fluid cooled electrical conductor assembly of claim 1, wherein said flared end defines a means for allowing said conductor to be bent relative to said sleeve.

3. The fluid cooled electrical conductor assembly of claim 2, wherein said flared end has an inside surface with a shape which affects an extent to which said conductor may be bent relative to said sleeve.

4. The fluid cooled electrical conductor assembly of claim 2, wherein said flared end further defines a means for reducing fatigue failure of said conductor when said conductor is bent relative to said sleeve.

5. The fluid cooled electrical conductor assembly of claim 1, wherein said flared end has an inside surface with a shape which affects an extent to which said conductor may be bent relative to said sleeve.

6. A fluid cooled electrical conductor assembly, comprising:

an electrical conductor having a longitudinal direction and an end;

a terminal having an open end, a fluid passage in communication with said open end, and an inside face disposed between said fluid passage and said open end, said inside face oriented substantially perpendicular to said longitudinal direction;

a sleeve disposed around said conductor end, said sleeve at least partially received within said open end of said terminal, said sleeve and said conductor end being metallurgically bonded to said inside face of said terminal, said sleeve having a longitudinally extending groove which is in communication with said fluid passage in said terminal; and a casing connected to said terminal and surrounding said conductor to thereby define a fluid passageway at a periphery of said conductor.

7. The fluid cooled electrical conductor assembly of claim 6, wherein said sleeve is soldered to said terminal.

8. The fluid cooled electrical conductor assembly of claim 7, wherein said sleeve is soldered to said terminal at an exterior of said sleeve, such that fluid flow through said longitudinally extending groove is not substantially affected.

9. The fluid cooled electrical conductor assembly of claim 7, wherein said sleeve is soldered to said terminal at an end of said sleeve.

10. The fluid cooled electrical conductor assembly of claim 7, wherein said sleeve is soldered to said terminal at a periphery of said sleeve.

* * * * *